United States Patent
Ottens et al.

(10) Patent No.: US 7,088,431 B2
(45) Date of Patent: Aug. 8, 2006

(54) LITHOGRAPHIC APPARATUS AND DEVICE MANUFACTURING METHOD

(75) Inventors: Joost Jeroen Ottens, Veldhoven (NL); Johannes Hubertus Josephina Moors, Helmond (NL); Peter Theodorus Maria Giesen, The Hague (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/736,778

(22) Filed: Dec. 17, 2003

(65) Prior Publication Data
US 2005/0134828 A1 Jun. 23, 2005

(51) Int. Cl.
G03B 27/62 (2006.01)
G03B 27/58 (2006.01)
H02N 13/00 (2006.01)

(52) U.S. Cl. .................... 355/75; 355/72; 361/234
(58) Field of Classification Search ................ 355/53, 355/72–76; 361/234; 310/10, 12
See application file for complete search history.

(56) References Cited

U.S. PATENT DOCUMENTS

| 4,384,918 A | 5/1983 | Abe |
| 4,502,094 A | 2/1985 | Lewin et al. |
| 4,551,192 A | 11/1985 | Di Milia et al. |
| 5,350,479 A | 9/1994 | Collins et al. |
| 5,522,131 A | 6/1996 | Steger |
| 5,539,179 A | 7/1996 | Nozawa et al. |
| 5,745,331 A | 4/1998 | Shamouilian et al. |
| 5,777,838 A * | 7/1998 | Tamagawa et al. .......... 361/234 |
| 6,023,405 A * | 2/2000 | Shamouilian et al. ....... 361/234 |
| 6,033,478 A * | 3/2000 | Kholodenko ................ 118/500 |
| 6,608,745 B1 * | 8/2003 | Tsuruta et al. .............. 361/234 |
| 6,628,503 B1 * | 9/2003 | Sogard ........................ 361/324 |
| 6,710,857 B1 * | 3/2004 | Kondo .......................... 355/72 |
| 2005/0041364 A1 * | 2/2005 | Kellerman et al. ......... 361/234 |

FOREIGN PATENT DOCUMENTS

| EP | 0947884 A2 * | 6/1999 |
| JP | 02002231799 A * | 8/2002 |
| JP | 02002270618 A * | 9/2002 |

* cited by examiner

*Primary Examiner*—Henry Hung Nguyen
(74) *Attorney, Agent, or Firm*—Pillsbury Winthrop Shaw Pittman, LLP

(57) ABSTRACT

A lithographic apparatus includes an illumination system for providing a beam of radiation, an article support for supporting a flat article to be placed in a beam path of the beam of radiation on the article support, an electrostatic clamp for clamping the article against the article support by an electrostatic field during projection, and a recessed backfill gas feed arranged in the article support for feeding backfill gas to a backside of the article when supported by the article support. According to one aspect of the invention, the recessed backfill gas feed includes a shielding layer for shielding the backfill gas in the recessed backfill gas feed from the electrostatic field.

13 Claims, 4 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus, an article support, and a device manufacturing method.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the beam in a given direction (the "scanning"-direction) while synchronously scanning the substrate parallel or anti-parallel to this direction.

In lithographic processing, passing of the beam through gas compositions present between the illumination system and the articles to be illuminated, in particular non-homogenous gas compositions, may cause undesired effects such as absorption, diffraction and refraction. These effects may have an adverse effect on illumination quality, in particular on a resolution to be reached for the ever increasing demand in imaging performance. A new generation of lithography, the EUV-lithography, which uses a beam in the Extreme Ultraviolet area, therefore operates in or near vacuum conditions in order to allow to pass the beam of radiation substantially unhindered to an article to be placed in the beam.

This vacuum technology offers challenges in terms of temperature control. For the article support, only a very small part (ranging from 0.1 to 3% of a total area) of the bottom side of the article actually mates physical contact with the article support when supported thereby, since the protrusions are shaped to provide only a very small contact area and the protrusions are furthermore arranged spaced relatively wide apart. In the vacuum pressure ranges that are used, thermal conductivity is substantially proportional to the pressure, which means that the thermal energy absorbed by the article when placed in the beam can no longer adequately be diverted, so that unwanted thermal heating of the article supports, leading to thermal expansion and resulting projection inaccuracies or potentially to even the loss of the article. To overcome this problem, a back-fill gas is introduced on the backside of the article offering a thermal conduction from the article to the article support to divert the thermal energy absorbed by the article. An electrostatic wafer support is for instance known from U.S. Pat. No. 6,628,503.

In the context of this application, the "article" may be any of the above mentioned terms wafer, reticle, mask, or substrate, more specifically terms such as: a substrate to be processed in manufacturing devices employing lithographic projection techniques; or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

For a proper and quick proliferation of the backfill gas along the supporting area of the article support, a channel is present that provides channeling of the backfill gas over the entire support area in a quick manner. The channel usually comprises a linked pattern of trenches or troughs, that substantially transports the backfill gas to the entire area of the support.

Conventionally, the article support is provided with protrusions that are arranged to improve the flatness of the substrate. These protrusions have a general diameter of 0.5 mm and are located generally at a distance of 3 mm away from each other and thereby form a bed of supporting members that support the substrate. Typically, the height of the protrusions lies in the range 1 mu m–15 mu m. Due to the relative large spaces in between the protrusions, contaminations possibly present generally do not form an obstruction for the flatness of the substrate, since these will be lying in between the protrusions and will not lift the substrate locally. The gap that is formed by these protrusions between the dielectric and the backside of the article is small enough to prevent the occurrence of breakdown, once electrode is energized and the article is clamped. However, it has been found, that in the channel, the local gap defined by the height between the bottom of the channel and the backside of the article increases substantially relative to the normal gap height between the dielectric and the backside of the article. This provides a substantial risk of voltage breakthrough in the gas feed region. In addition, there is a desire to design the channel in such a way that the clamp may be used in non-vacuum conditions, since for tuning and testing purposes, it is convenient to operate the electrostatic clamp without applying vacuum. Especially in non-vacuum conditions, breakthrough is likely to occur when the clamp is turned on.

SUMMARY

One aspect of the invention is to provide an article support provided with a channel that does not suffer from the above identified voltage breakdown problems and that is operable even in non-vacuum conditions.

One aspect of the invention provides a lithographic apparatus wherein the recessed channel comprises a shielding layer for shielding the channel structure from the electrostatic field. Thus, breakthrough in the channel is effectively prevented. Beneficially, the shielding layer prevents or at least diminishes an effective attractive electrostatic field to be developed above the channel. Although effectively reducing an overall applied clamping force, especially the absence of clamping pressure above the channel is profitable, since due to an effective support in that area, the applied clamping pressure results in unwanted deformation of the article, which contributes negatively to image resolution of the lithographic apparatus.

In a preferred embodiment, the recessed backfill gas feed comprises a channel for transporting the backfill gas over a supporting area of the article support, the channel comprising the shielding layer. Preferably, the shielding layer comprises a conducting layer enveloping the recessed backfill gas feed.

Further, preferably, the shielding layer is kept at a predetermined voltage relative to the article, thus effectively causing a shielding effect and annihilating the electrostatic field above the channel. Note, that the conducting layer may be the top layer of the channel, or may be a deeper buried layer, as long as effective shielding is obtained. The shielding layer may be a grounded layer. Additionally, the article support may comprises a ground electrode for contacting the article during support. To this end, in a preferred embodiment the shielding layer may contact the article during support.

The electrostatic clamp may comprise an electrode extending over the supporting area of the article support and a dielectric layer, the dielectric layer covering the electrode. The channel may be comprised in the dielectric layer. The dielectric layer may comprise a plurality of supporting protrusions for supporting the article.

In one embodiment, the article support is a support for supporting a patterning device, the patterning device serving to impart the beam with a pattern in its cross-section. In another embodiment, the article support is a substrate table for holding a substrate to be patterned by a patterned beam onto a target portion of the substrate Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in she target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support may be a frame or table, for example, which may be fixed or movable and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
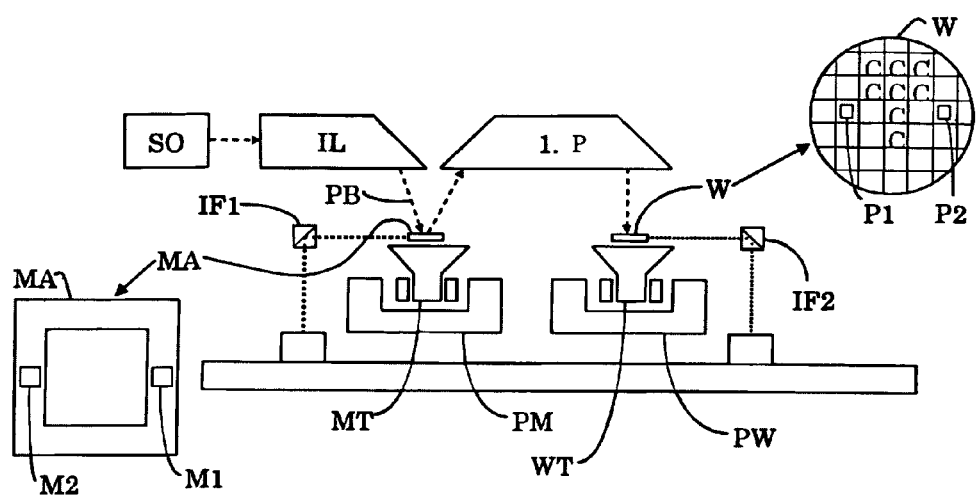
FIG. 1 depicts a lithographic apparatus according to an embodiment of the invention.

FIG. 1 schematically depicts a lithographic apparatus according to an embodiment of the invention. The apparatus comprises: an illumination system (illuminator) IL for providing a beam PB of radiation (e.g. UV or EUV radiation); a first support (e.g. a mask table) MT for supporting patterning device (e.g. a mask) MA and connected to first positioning device PM for accurately positioning the patterning device with respect to a projection system ("lens") PL; a substrate table (e.g. a wafer table) WT for holding a substrate (e.g. a resist-coated wafer) W and connected to second positioning device PW for accurately positioning the substrate with respect to the projection system PL; and the projection system (e.g. a reflective projection lens) PL for imaging a pattern imparted to the beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source SO. The source and the lithographic apparatus may he separate entities, for example when the source is a plasma discharge source In such cases, the source is not considered to from part of the lithographic apparatus and the radiation is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjuster that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the beam of radiation PB, having a desired uniformity and intensity distribution in its cross-section.

The beam PB is incident on a patterning device, illustrated in the form of the mask MA, which is held on the mask table MT. Being reflected by the mask MA, the beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the de-magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device may be updated alter each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
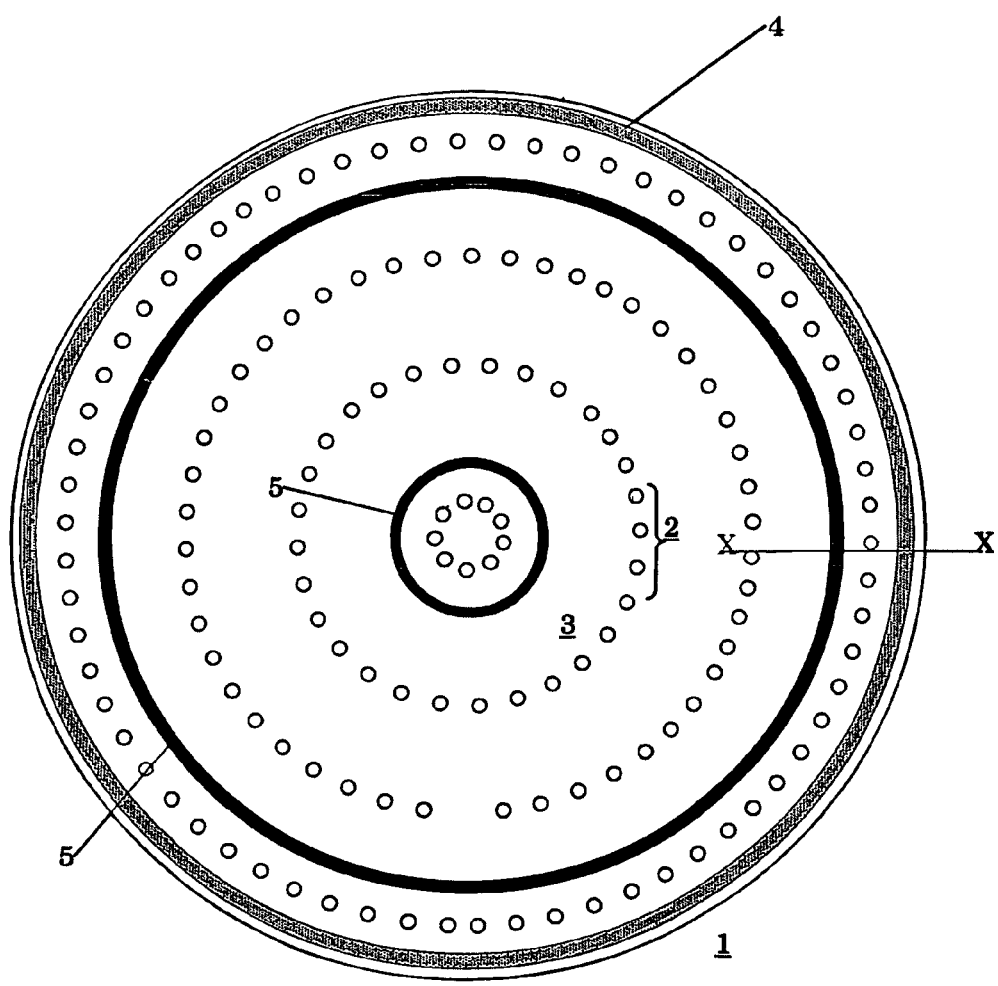
FIG. 2 depicts an embodiment of the article support according to an embodiment of the invention.

FIG. 2 depicts an article support 1. In this embodiment, the article support 1 is for supporting a wafer, shortly to be called wafer support table or wafer table, and generally circular in form, which is common for wafer support tables. However, the article support 1 may also be of another shape, in particular, a square shape. The wafer support table 1 comprises a plurality of protrusions 2 that are dimensioned to provide a flat support for supporting a wafer (not shown in FIG. 2). For clarity's sake, only a few protrusions 2 are referenced. The protrusions 2 thereby define a support zone 3. The boundary of the support zone 3 is formed by a surrounding wall 4, which may form a seal for confining backfill gas (not shown). In the wafer support table 1 backfill gas is introduced via gas feeds which are located at selected positions. In the shown embodiment, the feeds are shaped according a channel 5.

Figure 3:
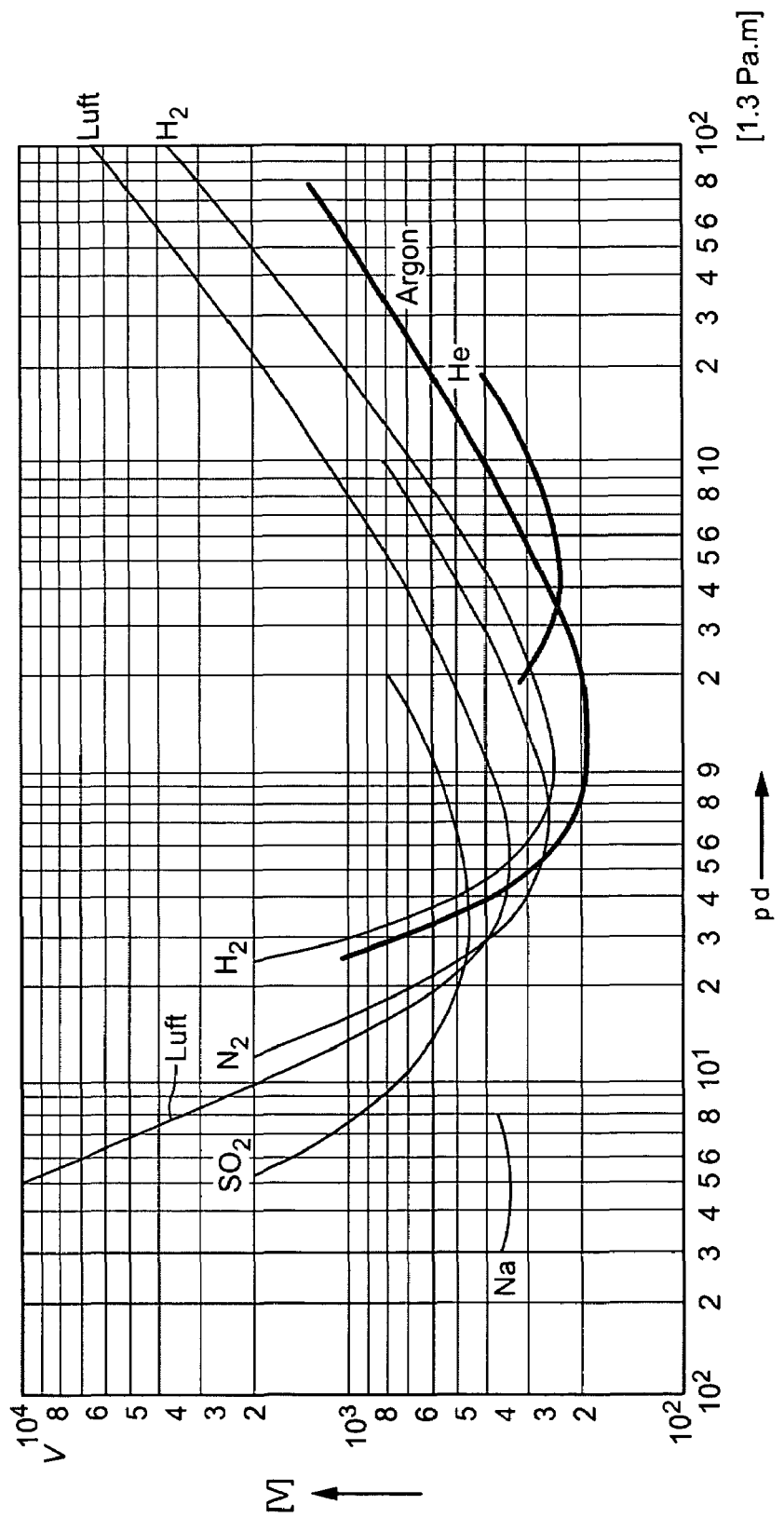
FIG. 3 depicts a typical graph of the Paschen curve for embodiments of the invention.

FIG. 3 depicts a typical graph of the Paschen curve for a number of gas mixtures in accordance with embodiments of the invention. In general, a Paschen curve is a well known theoretical relationship for the direct-current breakdown voltage of two parallel-plane electrodes immersed in a gas as a function of the gas pressure and electrode separation. This relationship predicts the occurrence of a minimum breakdown voltage for a certain product of the pressure times the separation. This minimum voltage is on the order of 200 to 500 volts for the applied gap height, depending on the gas mixture. This minimum is reached at a certain combination of p (pressure) and d (gap or distance). The gap being the height of the protrusions 2. The product of p and d is a measure for this. For a typical protrusion height of 5 mu this product amounts to 0.5*1.33 Pa·m, which is found typically on the far left side of the dip illustrated in the graph. As a consequence, even in ambient atmosphere, for a typical voltage used for electrostatic clamping, breakthrough is not likely. However, the product for a typical gap in the channels (the gap in the channels being the distance between the bottom of the channel and the backside of the article supported by the protrusions 2) amounts to 50 mu, which gives rise to 5*1.33 Pa·m, i.e. typically to the right of the dip. Hence during removal of ambient air, the systems crosses the Paschen dip, where breakdown is likely to occur.

Figure 4:
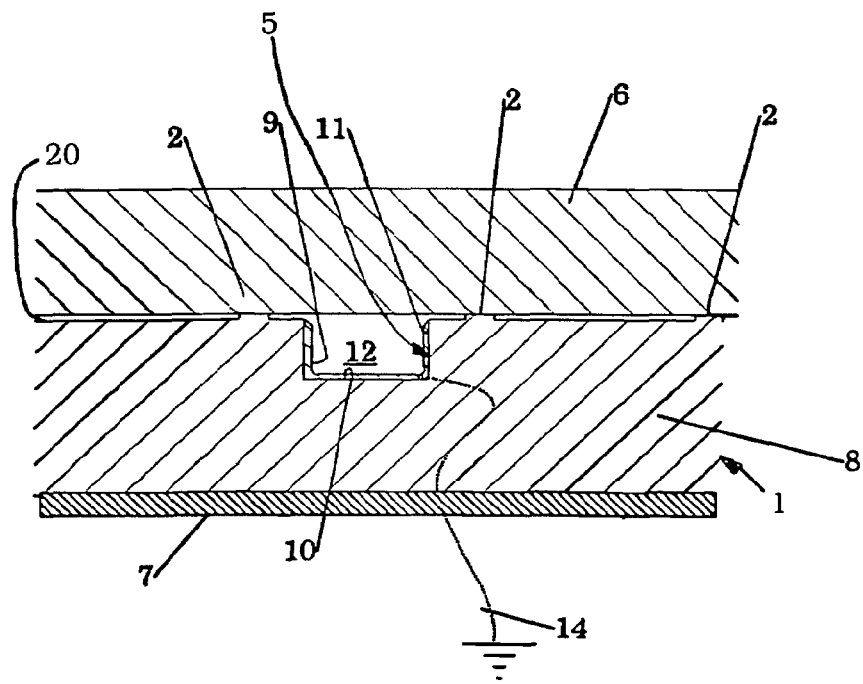
FIG. 4 depicts a detailed cross-sectional view of the line X—X shown in FIG. 2.

FIG. 4 depicts a detailed cross-sectional view of the wafer table 1 across line X—X shown in FIG. 2. A wafer 6 is depicted on the wafer table 1. Accordingly, there is shown a first and second protrusion 2, of a general height of about 5 mu. The electrode 7 provides an electric field over this gap 20 (the height of the gap equates to the height of the protrusions 2) that does not exceed the voltage according to the Paschen dip. However, in the channel 5, due to the absence of dielectric 8, the Pacehen dip voltage may be exceeded, especially when the wafer table 1 is operated in variable non-vacuum conditions for testing purposes. The channel gap 12 provided between the bottom 10 of the channel 5 and to backside of to wafer 6 ranges from 10–200 mu. In to embodiment of FIG. 4, the effects of the electrostatic field are mitigated by introducing a shielding layer 9 shielding the electrostatic fields in the gap 12. The shielding layer 9 can be a cover layer, but can also be buried in the article support 1. The shielding layer 9 envelopes the bottom 10 and side walls 11 of the channel 5 and therefore effectively shields the gap 12 formed between the bottom 10 and backside of the wafer 6 from electrostatic fields, so that the voltage difference in the gap 12 does not exceed the Paschen dip voltage. In the embodiment of FIG. 4, the shielding layer 9 may be grounded as illustrated by reference number 14. The wafer 6 need pot be grounded since in normal operating conditions, to voltage of the wafer does not exceed 90 Volts due to EUV irradiation.

Figure 5:
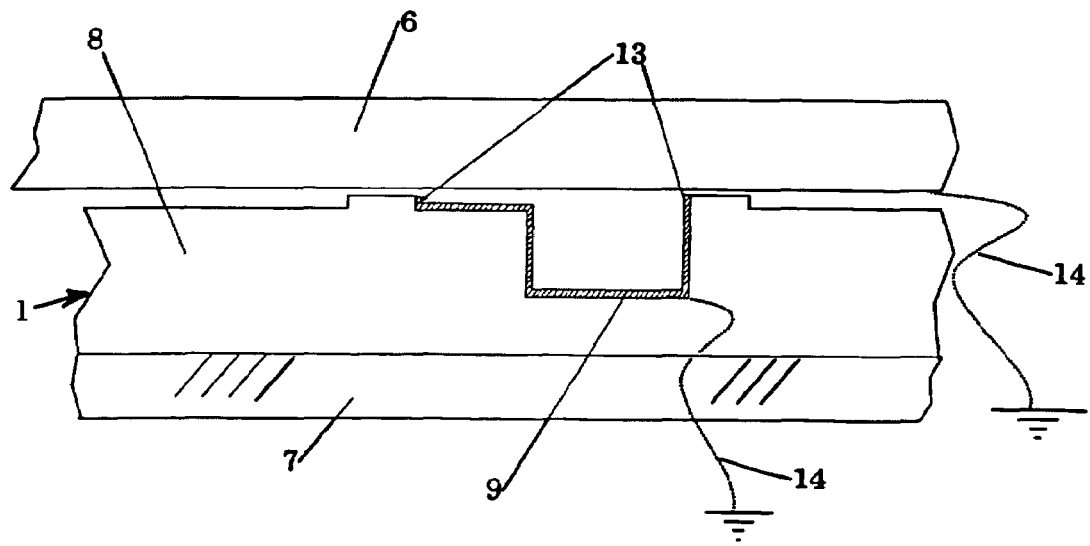
FIG. 5 depicts an alternative embodiment of the cross-sectional view of the line X—X shown in FIG. 2.

In FIG. 5, a configuration is depicted where side walls 13 of at least some of the protrusions 2 are also covered by the shielding layer 9. This offers an additional benefit that the substrate 6 is electrically coupled to the shielding layer 9 for offering an improved shielding effect. The wafer 6 and/or the shielding layer 9 may be coupled to ground potential as indicated by the dotted line 14. However, when a stable electrical connection between the shielding layer 9 and the wafer 6 is provided, such may not be necessary. In addition, such a substrate holder 1 may be manufactured quite easily after covering a substrate holder 1 by a metal layer, the tops of the protrusions 2 may be cleared and smoothed by a polishing process or the like.

While specific embodiments of the invention have been described above, it will be appreciated that the aspects of the invention may be practiced otherwise than as described. The description is not intended to limit the aspects of the invention.

What is claimed is:

1. A lithographic apparatus comprising.
   an illumination system constructed to provide a beam of radiation;
   an article support constructed to support an article to be placed in a beam path of said beam of radiation on said article support;
   an electrostatic clamp to clamp said article against said article support by an electrostatic field during projection;
   protrusions to support said article; and
   a recessed backfill gas feed arranged in said article support to provide backfill gas to a backside of said article when said article is supported by said article support,
   said recessed backfill gas feed includes a channel to transport said backfill gas over a supporting area of said article support, said channel including a shielding layer to shield said backfill gas in said recessed backfill gas feed from said electrostatic field.

2. A lithographic apparatus according to claim 1, wherein said article is substantially flat.

3. A lithographic apparatus according to claim 1, wherein said shielding layer includes a conducting layer enveloping said recessed backfill gas feed.

4. A lithographic apparatus according to claim 1, wherein said shielding layer is maintained at a predetermined voltage relative to said article.

5. A lithographic apparatus according to claim 1, wherein said shielding layer is a grounded layer.

6. A lithographic apparatus according to claim 3, wherein said article support includes a ground electrode to contact said article while said article is being supported by said article support.

7. A lithographic apparatus according to claim 1, wherein said shielding layer contacts said article while said article is being supported by said article support.

8. A lithographic apparatus according to claim 1, wherein said electrostatic clamp includes an electrode extending over a supporting area of said article support and a dielectric layer, said dielectric layer covering said electrode.

9. A lithographic apparatus according to claim 8, wherein said channel is formed in said dielectric layer.

10. A lithographic apparatus according to claim 8, wherein
    said protrusions are formed in said dielectric layer.

11. A lithographic apparatus according to claim 1, wherein said article support supports a patterning device, said patterning device constructed to impart a cross-section of said beam of radiation with a pattern.

12. A lithographic apparatus according to claim 1, wherein
    said article support is a substrate table to bold a substrate to be patterned by said beam of radiation onto a target portion of said substrate.

13. An article support for a lithographic apparatus to support an article on said article support, said article support comprising:
    an electrostatic clamp to clamp the article against the article support by an electrostatic field during projection;
    protrusions to support the article; and
    a recessed backfill gas feed arranged in said article support to feed backfill gas to a backside of the article when supported by said article support,
    said recessed backfill gas feed includes a channel to transport said backfill gas over a supporting area of said article support, said channel including a shielding layer for shielding the backfill gas in said recessed backfill gas feed from said electrostatic field.

* * * * *